(12) United States Patent
Wiesbauer et al.

(10) Patent No.: US 6,967,606 B2
(45) Date of Patent: Nov. 22, 2005

(54) LOOP FILTER FOR A CONTINUOUS TIME SIGMA DELTA ANALOG TO DIGITAL CONVERTER

(75) Inventors: Andreas Wiesbauer, Pörtschach (AT); Martin Clara, Villach (AT); Antonio Di Giandomenico, Villach (AT); Luis Hernandez, Madrid (ES); Susana Paton, Madrid (ES)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/774,311

(22) Filed: Feb. 6, 2004

(65) Prior Publication Data

US 2005/0128115 A1 Jun. 16, 2005

Related U.S. Application Data

(60) Provisional application No. 60/520,977, filed on Nov. 18, 2003.

(51) Int. Cl.[7] .............................................. H03M 3/00
(52) U.S. Cl. ..................................... 341/143; 330/303
(58) Field of Search ................................ 341/143, 144, 341/155; 330/311, 310, 303

(56) References Cited

U.S. PATENT DOCUMENTS

| 5,440,270 A | * | 8/1995 | Sevastopoulos et al. .... 330/107 |
| 6,268,815 B1 | * | 7/2001 | Gustavsson et al. ........ 341/143 |
| 2003/0093448 A1 | * | 5/2003 | Roza ........................... 708/313 |

* cited by examiner

Primary Examiner—Peguy JeanPierre
(74) Attorney, Agent, or Firm—Maginot, Moore & Beck

(57) ABSTRACT

A loop filter for a continuous time sigma delta analog to digital converter which converts an analog input signal into a digital output signal, said loop filter comprising an active analog filter which includes active devices for providing a power gain, wherein the number of active devices is lower than the filter order of said active analog filter.

20 Claims, 13 Drawing Sheets

LOOP FILTER FOR A CONTINUOUS TIME SIGMA DELTA ANALOG TO DIGITAL CONVERTER

This application is a continuation of provisional application 60/520,977 filed Nov. 18, 2003.

The invention refers to a loop filter for a continuous time sigma delta analog to digital converter.

FIELD OF THE INVENTION

The sigma delta analog to digital converters are among the key components in modern electronics.

BACKGROUND

Continuous time (CT) sigma delta modulators can operate at a higher sampling frequency than their discrete time (DT) counterparts.

FIG. 1 shows a continuous time sigma delta analog to digital converter according to the state of the art. Continuous time sigma delta analog to digital converters (CT ΣΔ ADC) are widely employed in wireless communication receivers as well as in sensor interfaces. The continuous time sigma delta analog to digital converter according to the state of the art as shown in FIG. 1 comprises two major components, i.e. a loop filter and a quantizer.

FIG. 2 shows the loop filter of the conventional analog digital converter in more detail. As can be seen from FIG. 2, the loop filter according to the state of the art includes a number of integrator elements which are connected in series to each other. The output signal of each integrator element is fed to the input of the next integrator element. Further, the output signal of each integrator element may be coupled via a feed-forward branch ($C_i$) to a summing point at the output of the loop filter. In some loop filters, also feed-back branches are provided. As shown in FIG. 2 the loop filter of the conventional continuous time sigma delta analog to digital converter comprises an input terminal and receives the fed-back digital output signal of the analog-digital converter ADC comprising m bits. The digital output signal is supplied to at least one digital-analog converter (DAC1) which converts the feed-back digital output signal to an analog signal which is subtracted from the analog input signal of the analog-digital converter (ADC). Further, digital-analog converters (DAC2 . . . DACn) can also be implemented into the loop filter as shown in FIG. 2. In the example given in FIG. 2, the conventional loop filter comprises n−1 integrator stages and n digital-analog converters. The order of the loop filter is n−1. In conventional continuous time sigma delta analog to digital converters filters having a filter order ranging from 2 to 7 are normally employed. The loop filters used in the continuous time sigma delta analog to digital converter as shown in FIG. 1 has an open loop gain which is necessarily higher than one.

The transfer function of the loop filter as shown in FIG. 2 is defined by the ratio of the analog output signal of the loop filter ($U_f$) and the digital input signal ($U_{outdig}$). For each pole of the loop filter transfer function, an integrator element is employed requiring an active device.

Whereas passive filters are built from passive components such as resistors, capacitors and inductors, active filters do not include inductors. Active filters also use resistors and capacitors, but the inductors are replaced by active devices capable of producing a power gain. These active devices can range from simple transistors to integrated circuits (IC), controlled sources such as operation amplifiers (op amps) and operational transconductance amplifiers (OTA), generalized impedance converters (GIC) and frequency-dependent negative resistors (FDNR).

The voltage transfer function (VTF) is specified in the frequency domain. The poles of the VTF correspond to the roofs of its denominator polynomial. For each pole of the voltage transfer function VTF, the loop filter according to the state of the art as shown in FIG. 2 employs an active device such as an operation amplifier or an operational transconductance amplifier (OTA). For each zero of the voltage transfer function (VTF) of the loop filter, either a feed-forward branch (CI) or a feed-back digital-analog converter DAC is provided. In some loop filters, according to the state of the art, the feed-forward branches (CI) are built in those active elements such as voltage to current converters.

The higher the filter order of the filter, the greater is the selectivity of said filter. To achieve a certain filter selectivity, it is necessary to employ a loop filter with a certain filter order. When employing a loop filter according to the state of the art as shown in FIG. 2, the number of active devices provided within said loop filter is equal or even higher than the chosen filter order.

Since each active device consumes power, the power consumption of the analog-digital converter according to the state of the art as shown in FIG. 1 is increased with the filter order of the loop filter. Accordingly, a drawback of conventional continuous time sigma delta analog to digital converters according to the state of the art as shown in FIG. 1 is that the power dissipation of such a conventional analog-digital converter is high.

Consequently, it is the object of the present invention to provide a loop filter for a continuous time sigma delta analog to digital converter which minimizes the power dissipation of the analog-digital converter.

This object is achieved by a loop filter having the features of main claim 1.

SUMMARY

The invention provides a loop filter for a continuous time sigma delta analog to digital converter which converts an analog input signal to a digital output signal, said loop filter comprising an active analog loop filter which includes active devices for providing a power gain, wherein the number of active devices of said active analog filter is lower than the filter order of said active analog filter.

In a preferred embodiment, the active devices included in said active analog filter are operational amplifiers.

In an alternative embodiment, the active devices of said active analog filter are transconductance amplifiers.

In a further alternative embodiment, the active devices of said active analog filter are voltage to current converters.

In a preferred embodiment, the active analog filter is a cascaded analog filter, comprising cascaded analog filter elements which are connected in series to each other.

In a preferred embodiment, the cascaded analog filter elements are cascaded biquad filter elements.

In an alternative embodiment, the cascaded analog filter elements are cascaded lattice filter elements.

In a preferred embodiment, at least one biquad filter element is a Sallen and Key filter element.

In a preferred embodiment, the loop filter comprises a first input terminal for applying the analog input signal of said analog-digital converter.

The loop filter comprises in a preferred embodiment an output terminal for supplying the output signal of the loop filter to a quantizer which quantizes the loop filter output signal to generate said digital output signal of said analog digital converter.

In a preferred embodiment, the digital output signal is fed back to a second input terminal of said loop filter. In a preferred embodiment, the loop filter comprises at least one digital-analog converter (DAC) which converts the digital output signal applied to said second input terminal of said loop filter into an analog signal.

In a preferred embodiment, the analog signal generated by said digital analog converter (DAC) is added to the analog input signal applied to said first input terminal of said loop filter.

The invention further provides a continuous time sigma delta analog to digital converter which converts an analog input signal to a digital output signal, wherein the continuous time sigma delta analog to digital converter comprises a loop filter which has an active analog filter which includes active devices providing a power gain, wherein the number of active devices is lower than the filter order of the active analog filter, and wherein the continuous time sigma delta analog to digital converter further comprises a quantizer which quantizes a loop filter output signal of said active loop filter to generate said digital output signal.

In a preferred embodiment of the continuous time sigma delta analog to digital converter, the loop filter comprises a first input terminal for applying the analog input signal.

In a preferred embodiment of the continuous time sigma delta analog to digital converter, the digital output signal of the quantizer is fed back to a second input terminal of said loop filter.

In a further embodiment of the continuous time sigma delta analog to digital converter, the loop filter comprises at least one digital-analog converter which converts the digital output signal applied to said second input terminal of the loop filter into an analog signal.

In a still further embodiment of the continuous time sigma delta analog to digital converter, the analog signal generated by the digital-analog converter (DAC) is subtracted from the analog input signal applied to the first input terminal of said loop filter.

In the following preferred embodiments of the loop filter for a continuous time sigma delta analog converter are described in detail.

DETAILED DESCRIPTION

Figure 3:
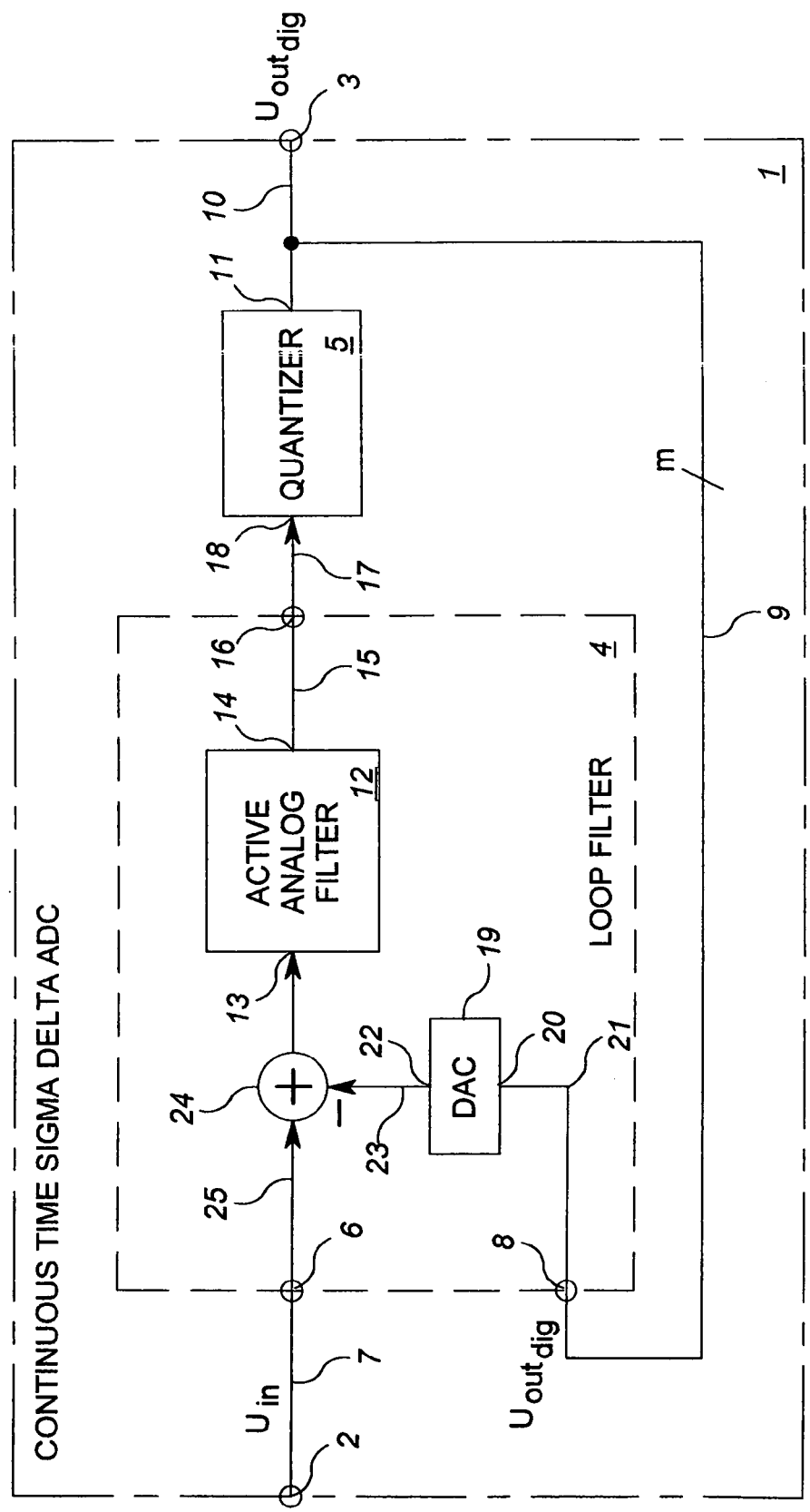
FIG. 3 shows a preferred embodiment of the continuous time sigma delta analog converter according to the present invention.

FIG. 3 shows a preferred embodiment of a continuous time sigma delta analog-digital converter 1 according to the present invention. The continuous time sigma delta analog-digital converter 1 converts an analog input signal ($U_{in}$) which is applied to an input terminal 2 of said continuous time sigma delta analog-digital converter 1. The analog-digital converter 1 converts the analog input signal ($U_n$) to a digital output signal ($U_{outdig}$) which is output via an output terminal 3 of the ADC_1. The continuous time sigma delta analog-digital converter 1 comprises two major components, i.e. the loop filter 4 and a quantizer 5 for quantizing the output signal of said loop filter 4.

The loop filter 4 has a first input terminal 6 which is connected to the input terminal 2 of the continuous time sigma delta analog-digital converter 1 via an internal line 7. The loop filter 4 further comprises a second input terminal 8 which is connected via a line 9 to a line 10 which connects an output 11 of the quantizer 5 to the output terminal 3 of the continuous time sigma delta analog-digital converter 1. By means of the feed-back lines 9, the digital output signal generated by the quantizer 5 is fed back to the second input terminal 8 of the loop filter 4.

The loop filter 4 comprises an active analog filter 12 having an input 13 and an output 14. The output 14 of the active analog filter 12 within the loop filter 4 is connected via an internal line 15 to an output terminal 16 of said loop filter 4. The output terminal 16 of the loop filter 4 is connected via a line 17 to an input 18 of the quantizer 5.

The loop filter 4 comprises at least one digital-analog converter 19 having an input 20 connected to the second input terminal 8 of the loop filter via a line 21. The digital-analog converter 9 further comprises an analog output 22 which is connected via a line 23 to an adder 24 of the loop filter 4. The adder 24 is further connected to the first input terminal 6 of the loop filter 4 via line 25. The digital-analog converter 19 converts the feed-back digital output signal $U_{outdig}$ to an analog signal which is added by means of said adder 24 to the analog input signal $U_{in}$ applied to the input terminal 2 of the continuous time sigma delta analog-digital converter 1. The continued feed-back loop controls the digital output signal $U_{outdig}$ such that the difference between the analog input signal $U_{in}$ and the converted analog output signal output by said digital-analog converter 19 is minimized. To achieve this, the active analog filter 12 provides for a signal amplification, wherein the open loop gain is higher than one. The gain of the active analog filter 12 is frequency-dependent to achieve stability of the regulating loop signal wherein a higher frequency signal is more attenuated than signals with lower frequencies. Accordingly, the active analog filter 12 forms an analog low-pass filter or an analog bandpass filter.

The active analog filter 12 includes active devices for providing the necessary power gain. These active devices are, in a preferred embodiment, operational amplifiers. In an alternative embodiment, the active devices within the active analog filter 12 are formed by a transconductance amplifier (OTA). In other embodiments, the active devices are formed by voltage to current converters or any other active device capable of producing power gain such as signal transistors or impedance converters.

The active analog filter 12 comprises a predetermined filter order N which is predetermined according to the application of the continuous time sigma delta analog-digital converter 1. If the selectivity of the active analog filter 12 is increased with increasing filter order N, according to the present invention, the number M of active devices provided within the active analog filter 12 is lower than the filter order (N) of said active analog filter 12. By minimizing the number of active devices within the active analog filter 12, the power consumption of the loop filter 4 within the continuous time sigma delta analog-digital converter 1 is also minimized so that the power dissipation of the analog-digital converter 1 according to the present invention is very low.

Figure 4:
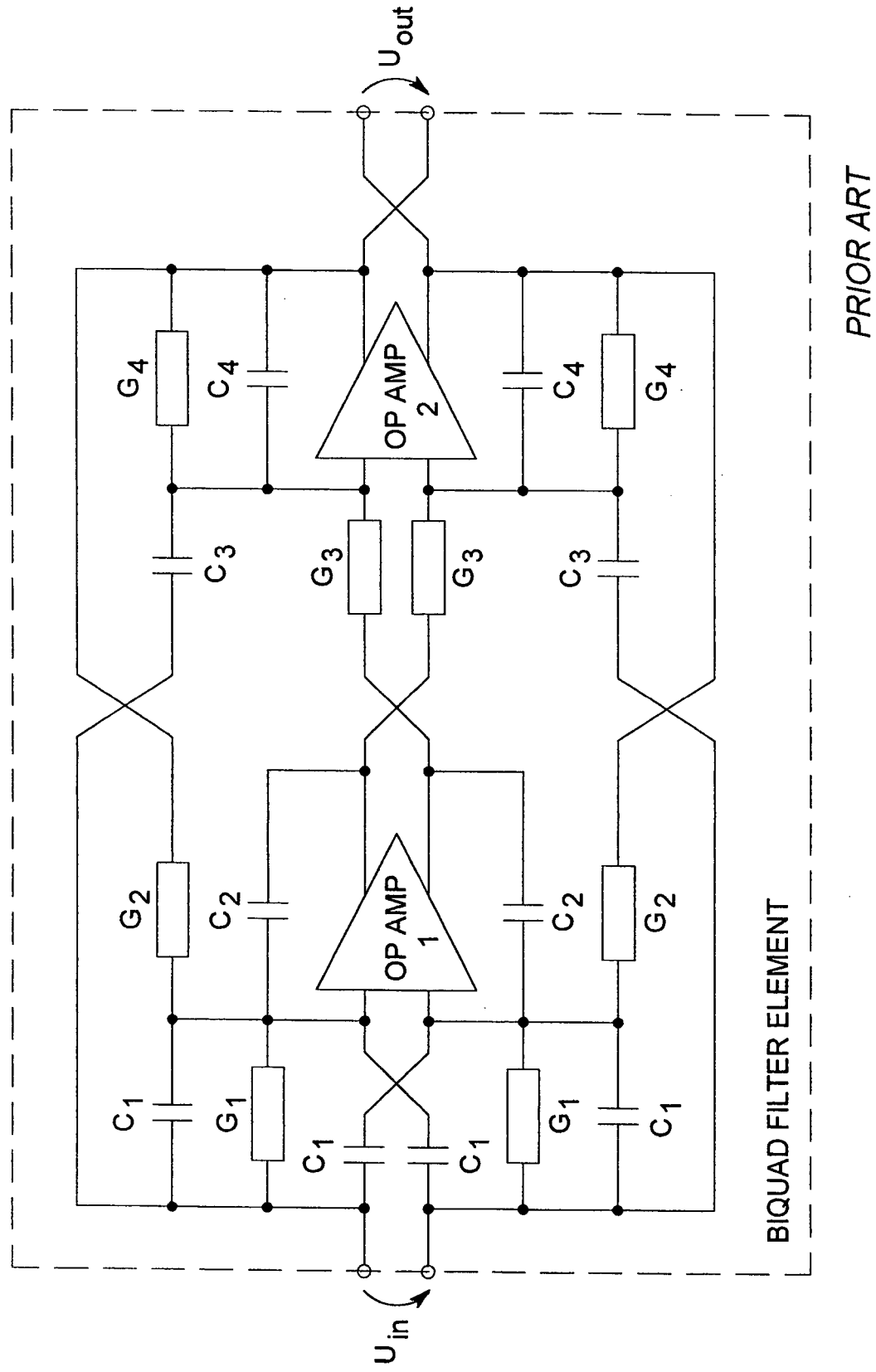
FIG. 4 shows a conventional biquad filter element.

FIG. 4 shows a conventional biquad filter element according to the state of the art.

The voltage transfer function VTF is given by:

$$VTF = \frac{G_1 \cdot G_3 + p(C_1 - c_1)G_3 + p^2 C_2 \cdot C_3}{G_2 \cdot G_3 + p \cdot C_2 \cdot G_4 + p^2 \cdot C_2 \cdot C_4} = \frac{U_{out}}{U_{in}} \quad (1)$$

The RC-active filter capable of realizing a biquad voltage transfer function, i.e. a transfer function whose numerator and denominator polynomials are second order is called a biquad filter.

The transfer function of a biquad filter is given by:

$$VTF_{BQ} = k \frac{(p + z_1)(p + z_2)}{(p + p_1)(p + p_2)} \quad (2)$$

wherein $z_i$ in the numerator represents zeros and $p_i$ in the denominator represent poles of the transfer function.

A biquad filter has two complex conjugate poles and two complex conjugate zeros. FIG. 4 shows a conventional biquad filter element of filter order two comprising two active devices, i.e. op amp 1 and op amp 2. In the biquad filter element shown in FIG. 4, the number of active devices is equal to the filter order of the filter element.

Figure 1:
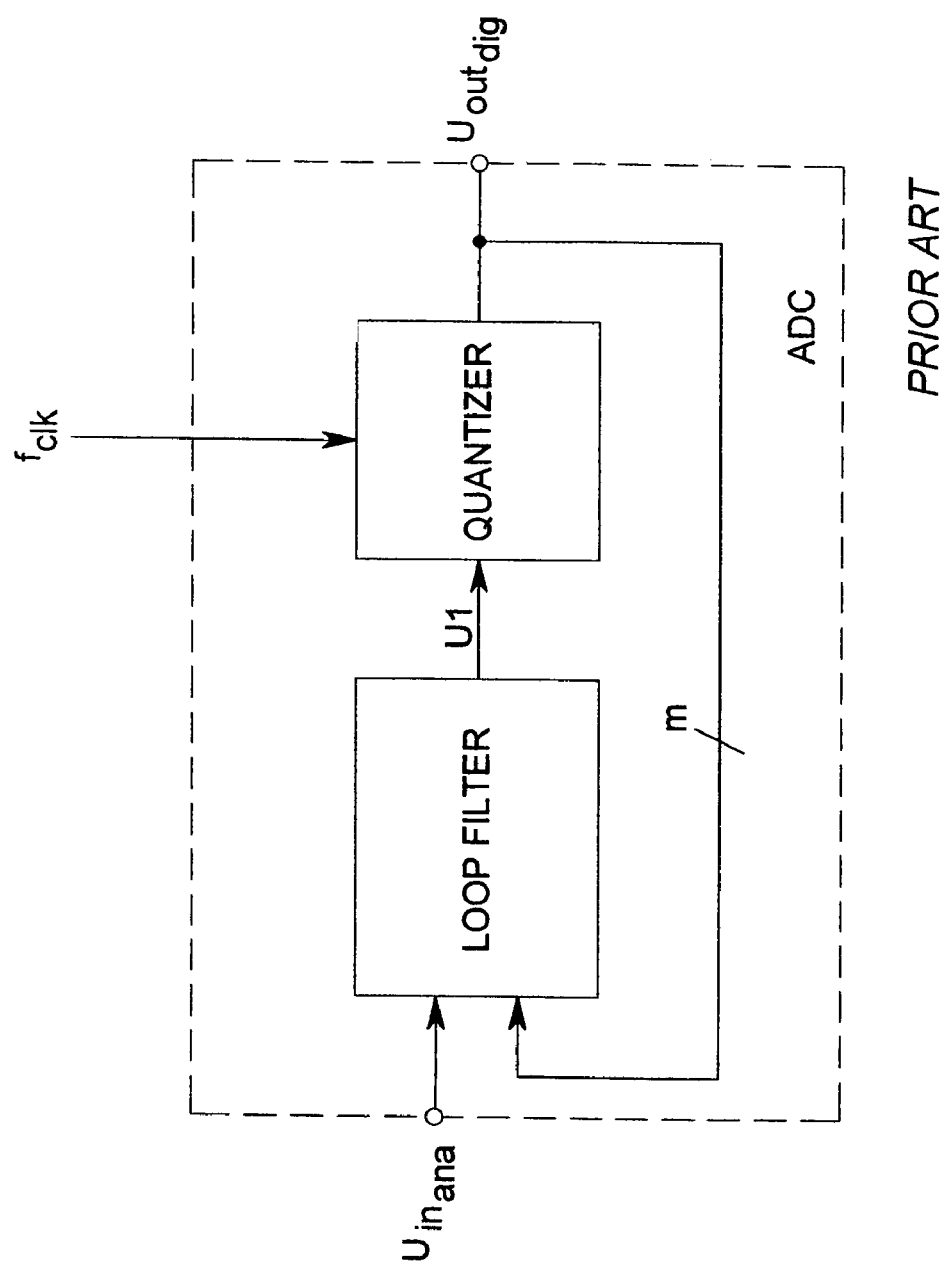
FIG. 1 shows a continuous time sigma delta analog converter according to the state of the art.
Figure 2:
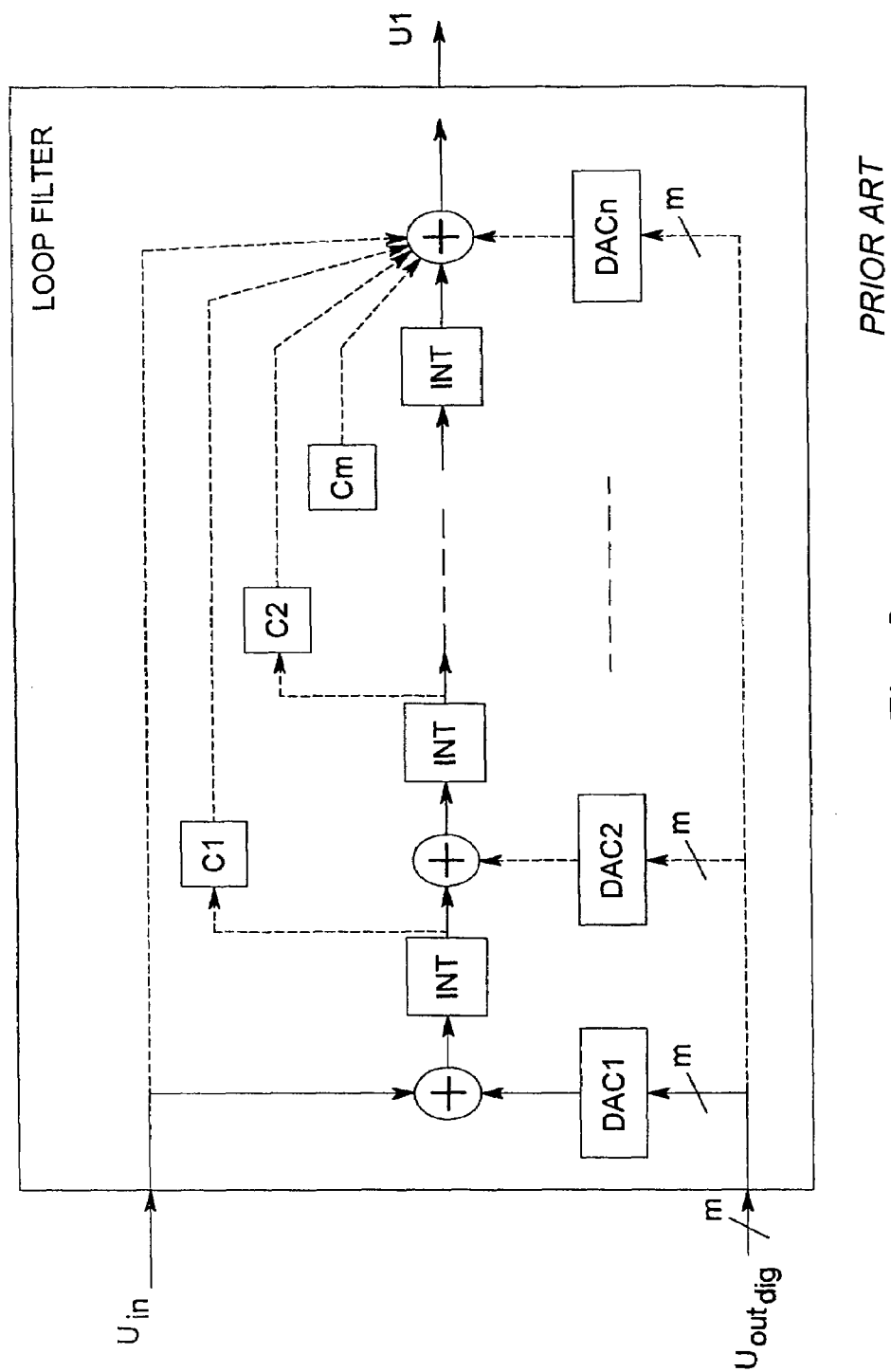
FIG. 2 shows a loop filter for a continuous time sigma delta analog converter according to the state of the art.

There exist biquad filter elements wherein the number of active devices employed is lower than the order of the filter element. Such a biquad filter element is the Sallen and Key filter element shown in FIG. 5. The voltage transfer function VTF of the Sallen and Key filter element as shown in FIG. 2 is given by:

$$VTF_{slk} = \frac{k \frac{1}{C_1 C_2 R_1 R_2}}{p^2 + p\left[\frac{1}{C_2 R_2} + \frac{1}{C_2 R_2} + \frac{1-k}{C_1 R_1}\right] + \frac{1}{C_1 C_2 R_1 R_2}} \quad (3)$$

wherein $$K = 1 + \frac{Rx}{Ry} \quad (4)$$

Figure 5:
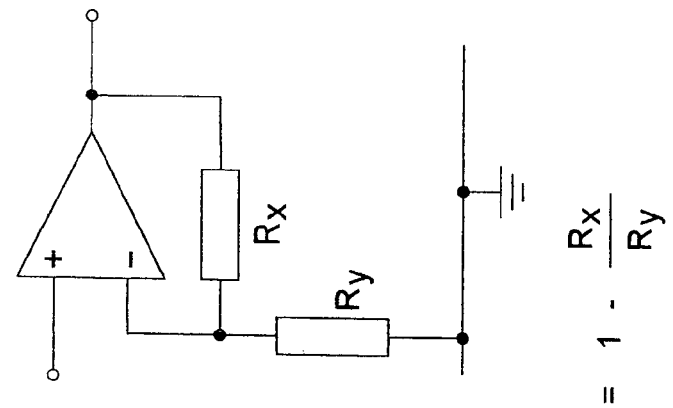
FIG. 5 shows a conventional Sallen and Key filter element of filter order two.
Figure 5:
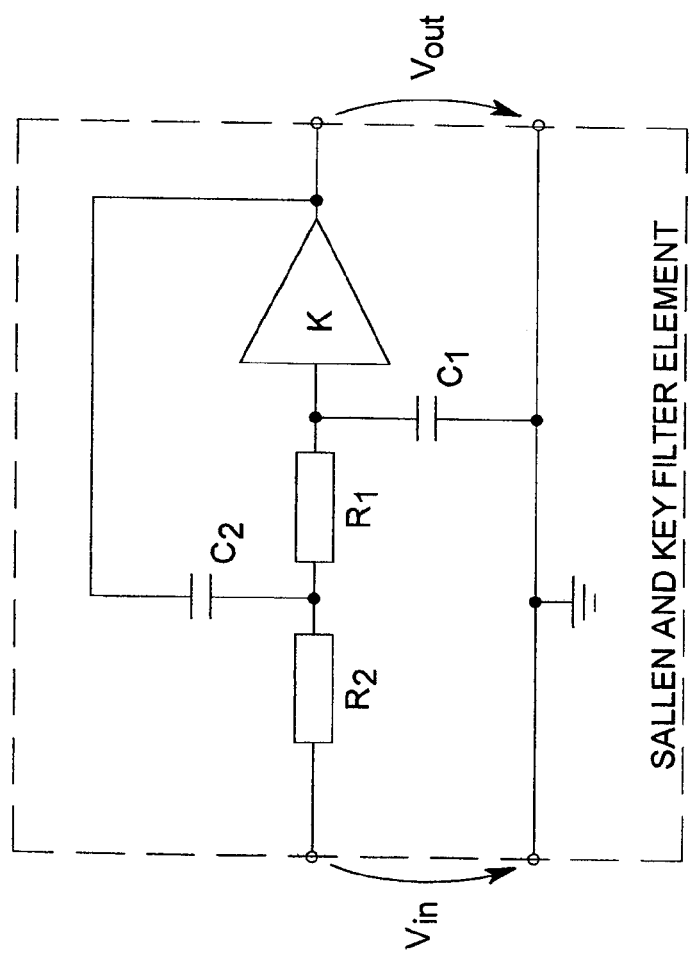

The Sallen and Key filter element as shown in FIG. 5 is a second-order filter element. The voltage transfer function VTF indicates that the Sallen and Key filter element is an all-pole low-pass filter element, since the numerator involves only a constant term.

Figure 6:
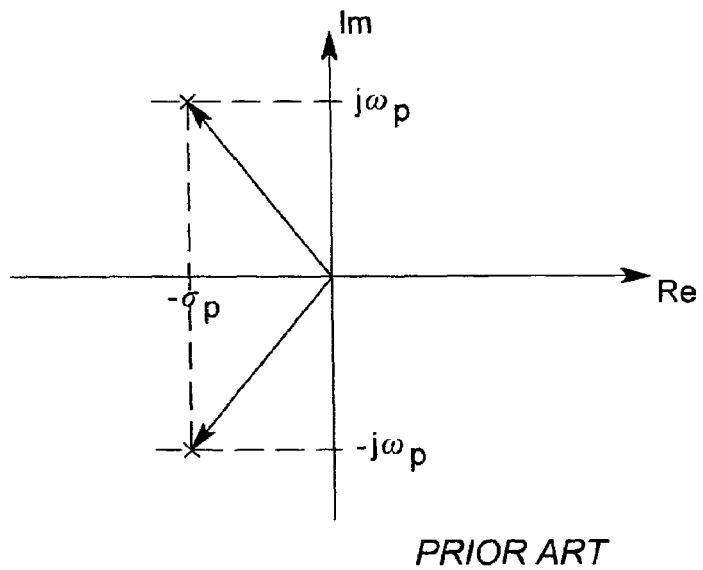
FIG. 6 shows the VTF poles of the Sallen and Key second-order filter elements as shown in FIG. 5.

FIG. 6 shows the poles of the second-order Sallen and Key filter element shown in FIG. 5.

As can be seen from FIG. 5, the Sallen and Key filter element is a biquad filter element of filter order two, but the number of active devices, i.e. the number of the operation amplifiers within the Sallen and Key filter element, is only one.

Figure 7:
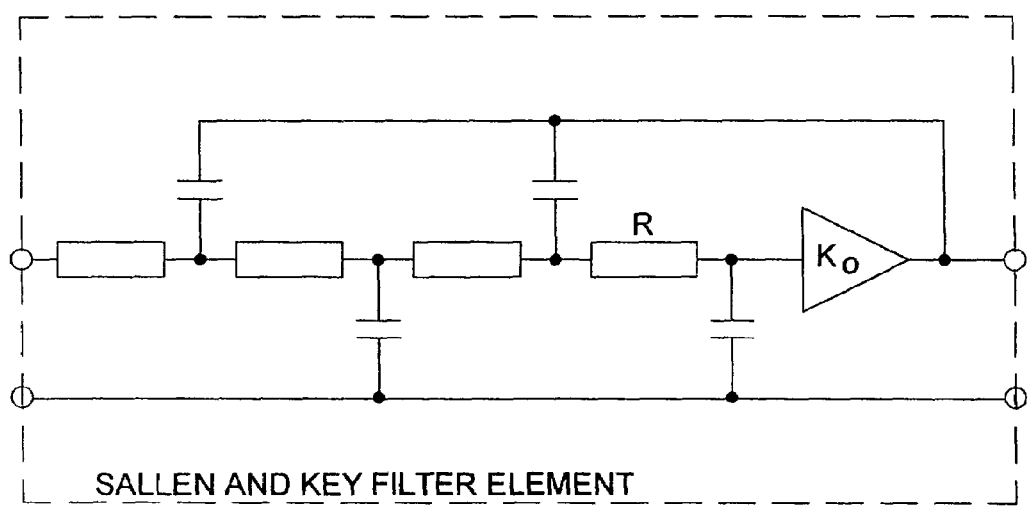
FIG. 7 shows a conventional Sallen and Key filter element of filter order five.

FIG. 7 shows a further Sallen and Key filter element employing only one operation amplifier to realize a higher order Sallen and Key filter element.

Figure 8:
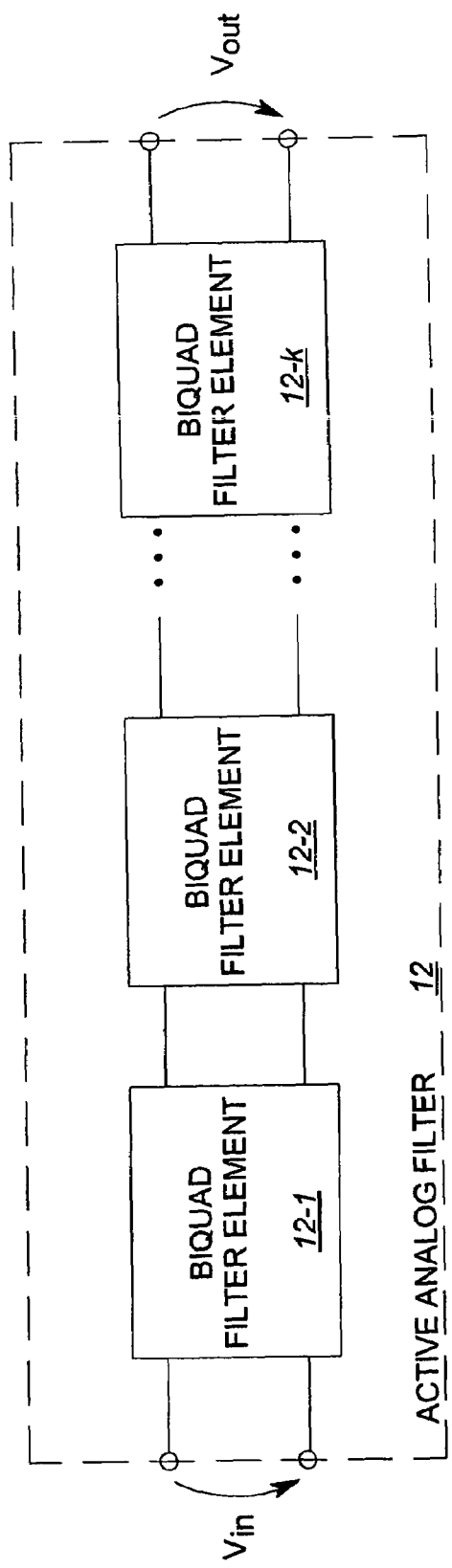
FIG. 8 shows a cascaded analog filter comprising cascaded analog biquad filter elements as employed in the present invention.

By cascading biquad filter elements, it is possible to form a filter of any order as shown in FIG. 8. For example, by cascading k Sallen and Key filter elements as shown in FIG. 8, it is possible to build a filter having the filter order 2k. This filter only includes k active devices so that the power consumption of such a filter is comparatively low.

Figure 9:
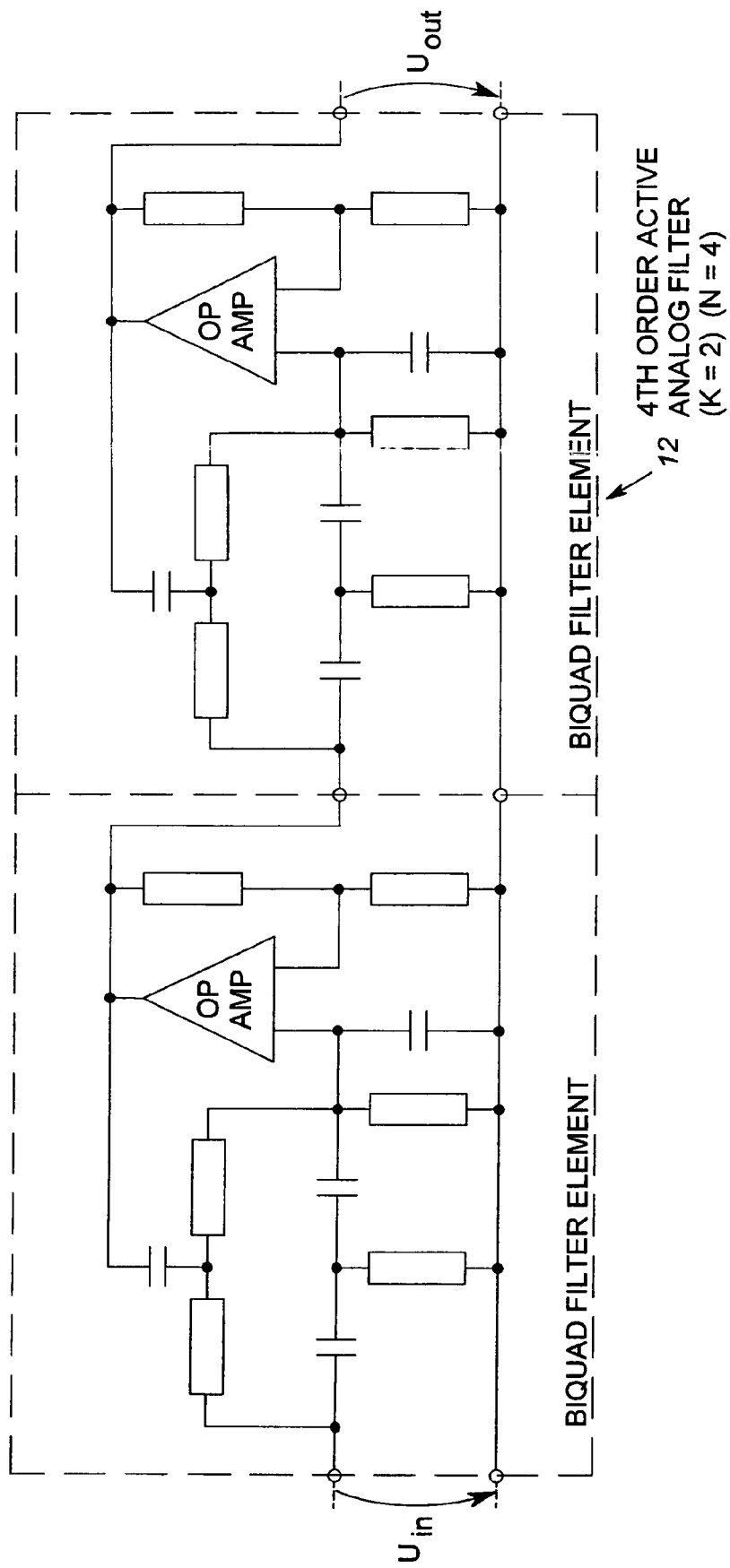
FIG. 9 shows a cascaded analog filter comprising cascaded analog biquad filter elements as employed in a preferred embodiment of the present invention.

FIG. 9 shows a fourth-order filter which is formed by two cascaded biquad filter elements. Each biquad filter element includes only one operational amplifier op amp. The voltage transfer function VTF of the filter shown in FIG. 9 comprises four poles and four real zeros.

Figure 10:
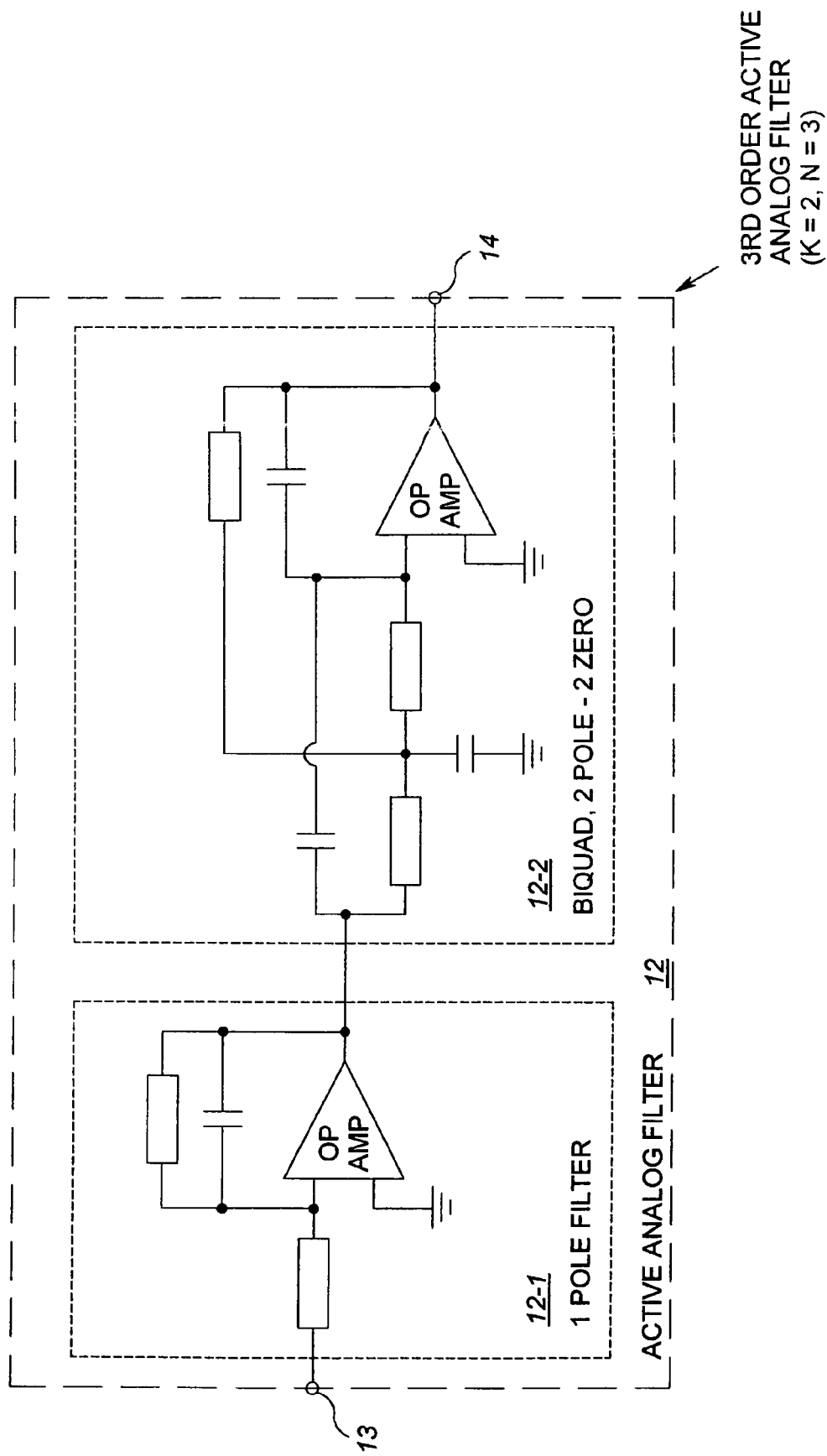
FIG. 10 shows a third-order analog filter as employed in a preferred embodiment of the present invention.

If the active analog filter 12 has an odd filter order, a cascade of biquad filter elements is connected in series to a one-poled analog filter as can be seen in FIG. 10. The third-order active analog filter 12 as shown in FIG. 10 comprises only two active devices, i.e. two op amps.

Figure 11:
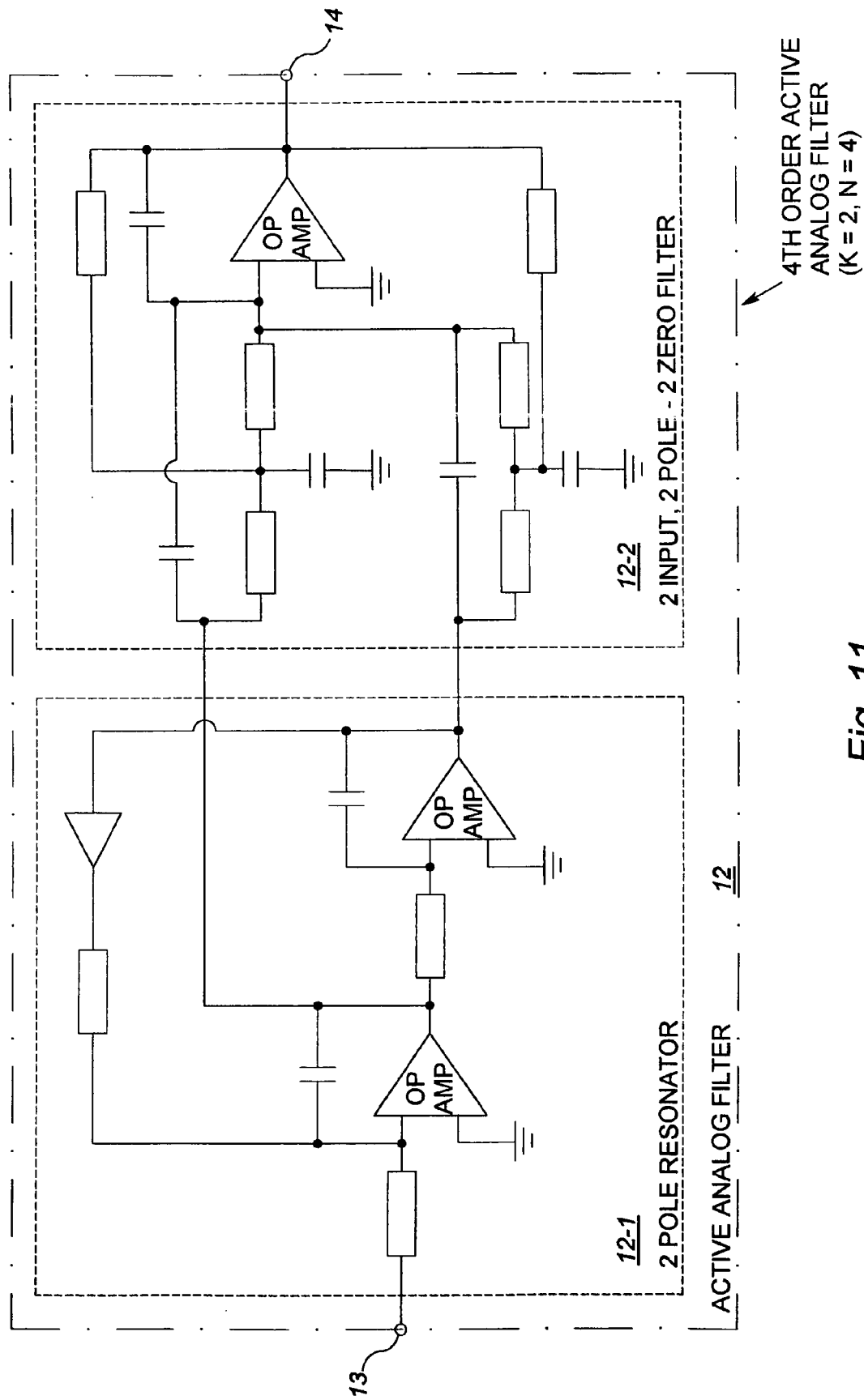
FIG. 11 shows a fourth-order active filter as employed in a preferred embodiment according to the present invention.

FIG. 11 is a further embodiment of an active analog filter 12 comprising two cascaded filter elements 12-1, 12-2, wherein the first filter element 12-1 is a two-pole resonator and wherein the second filter element 12-2 is a two-pole two-zero Sallen and Key filter element having two inputs. By employing a multiple input second filter element 12-2, the fourth-order active analog filter is realized without any feed-forward voltaged current converters, thus saving a further active device.

Figure 12:
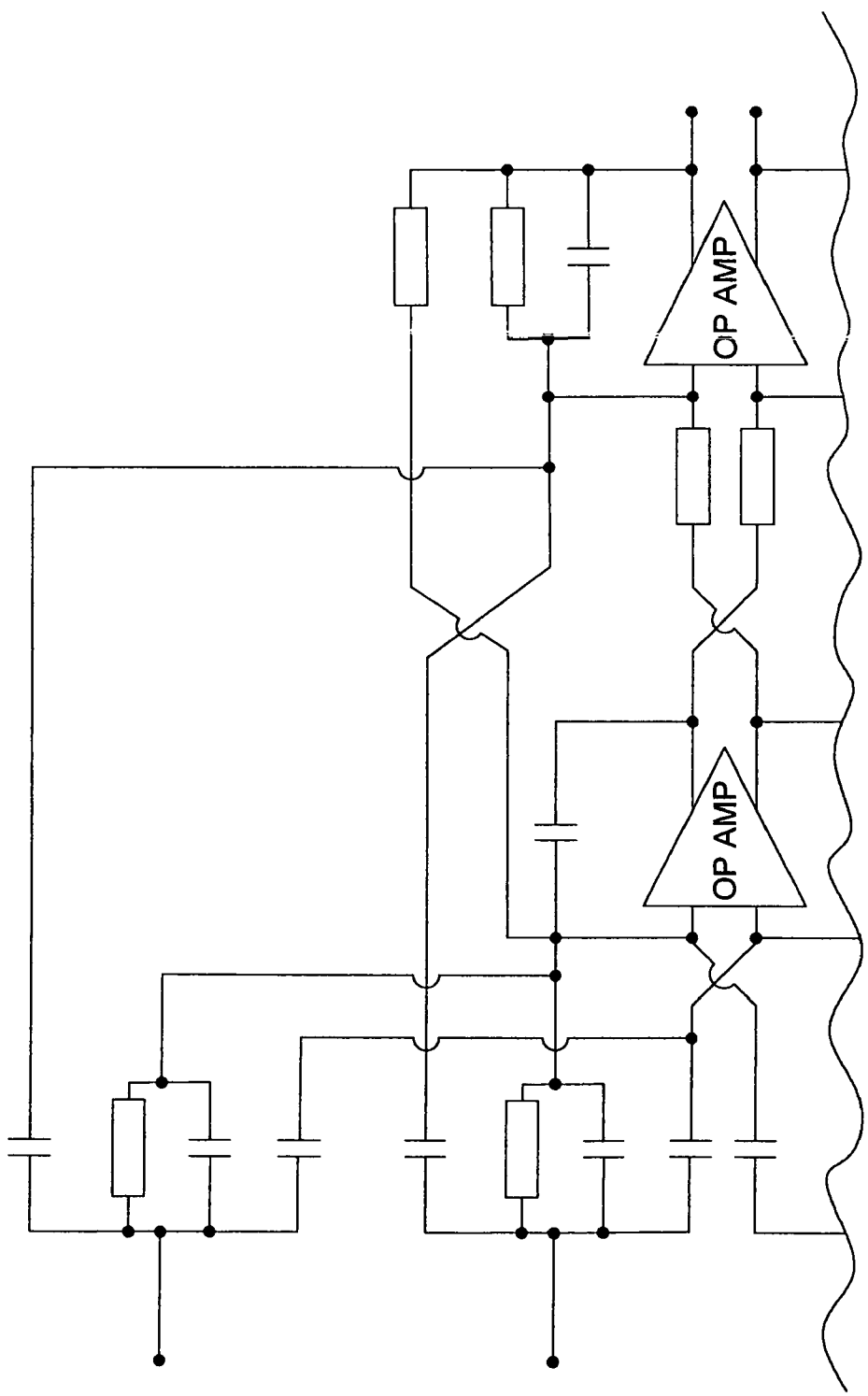
FIG. 12 shows a two input biquad filter which is employed in a preferred embodiment according to the present invention.

FIG. 12 shows a two-input biquad filter element which can be combined with a feed-forward topology as shown in FIG. 11. For the sake of simplicity, only one half of the symmetric circuit arrangement is depicted in FIG. 12.

Figure 13:
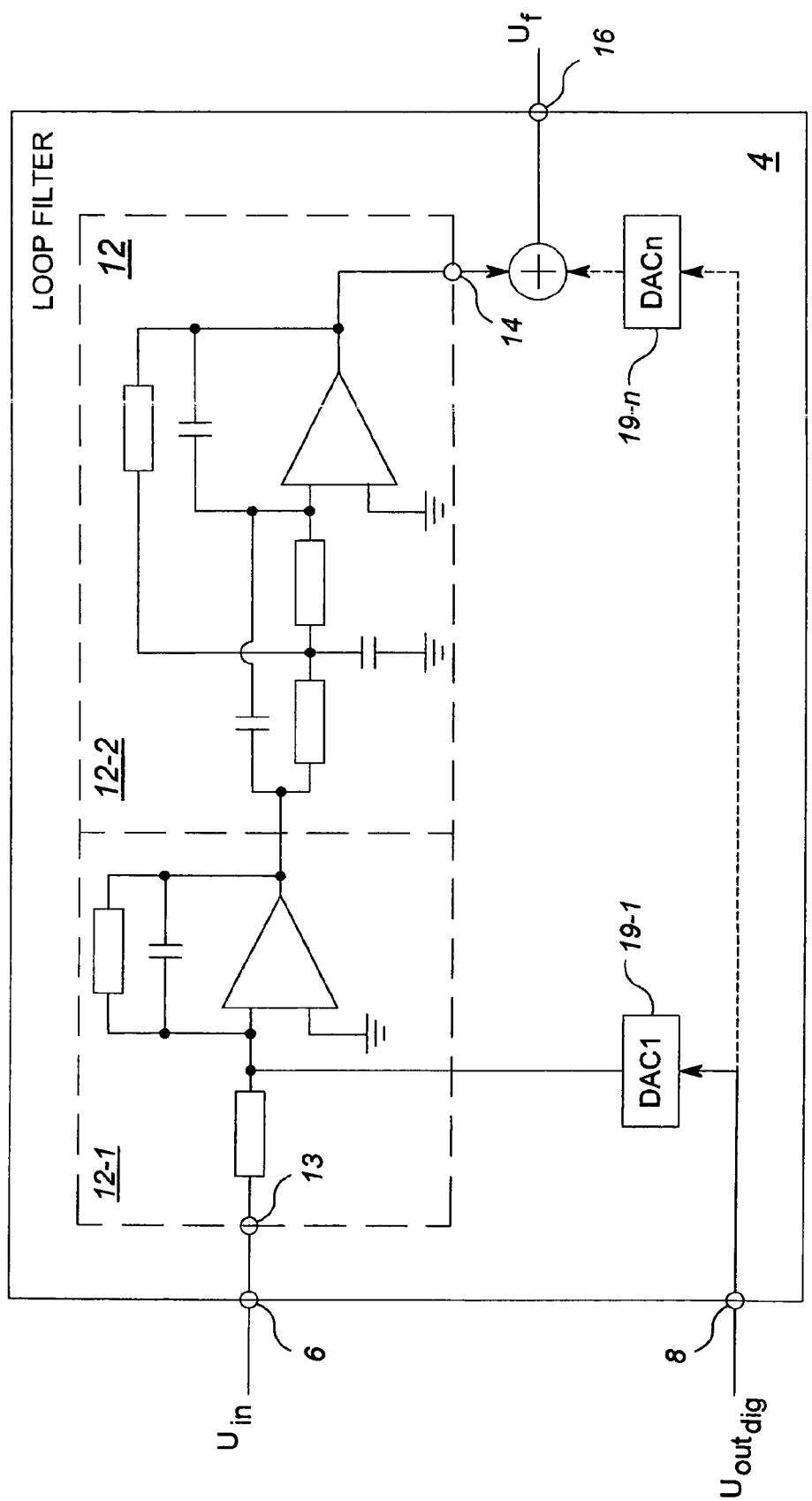
FIG. 13 shows the implementation of a continuous time sigma delta analog converter according to a preferred embodiment of the present invention.

FIG. 13 shows a preferred embodiment of the loop filter 4 according to the present invention. The loop filter 4 includes an active analog filter 12 as shown in FIG. 10. The active analog filter 12 is a third-order active analog filter which consists of two cascaded filter elements, i.e. a one-pole filter element 12-1 and a two-pole two-zero biquad filter element 12-2. The third-order active element 12 comprises only two operational amplifiers, i.e. the number of active devices in filter 12 is lower than the filter order of the filter 12.

Figure 14:
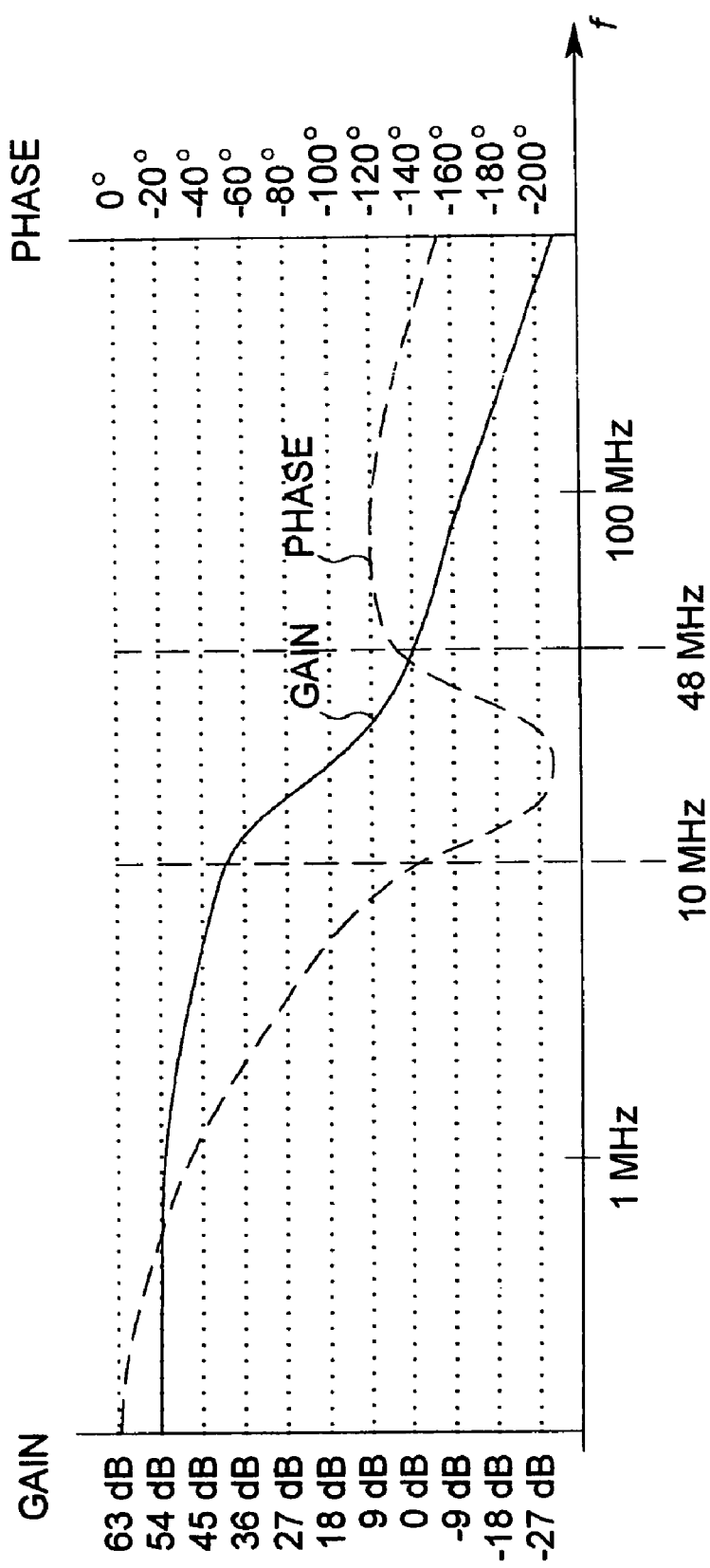
FIG. 14 shows the gain and phase response of the loop filter according to a preferred embodiment of the present invention as shown in FIG. 13.

FIG. 14 shows the signal and phase response of the active analog filter 12 as shown in FIG. 10. Within a passband frequency band ranging from 0 to 10 MHz, the analog filter 12 has the gain of more than 38 dB. At the unity gain frequency (48 MHz), the phase margin is approximately 50°.

The passband frequency range of 0 to 10 MHz corresponds to the passband frequency band of VDSL applications. In ADSL applications, the passband frequency range of the active analog filter 12 is chosen to be 0 to 2 MHz. The active analog filter forms part of the loop filter 3 as can be seen in FIG. 13. The digital-analog filter 19-n is optional and can be used for stability enhancement. Stability enhancement is only required when the oversampling inside the sigma delta loop is very low.

REFERENCE LIST 1 continuous time sigma delta analog-digital converter
2 input terminal
3 output terminal
4 loop filter
5 quantizer
6 input terminal
7 line
8 input terminal
9 feed-back line
10 line
11 output
12 active analog filter
13 input
14 output
15 line
16 output terminal
17 line
18 input
19 digital-analog converter
20 input
21 output
22 output
23 line
24 adder
25 line

What is claimed is:

1. A loop filter for a continuous time sigma delta analog to digital converter which converts an analog input signal into a digital output signal, the loop filter comprising:
   an input having an input signal, the input signal at least in part representative of the digital output signal of the sigma delta analog to digital converter;
   an active analog filter operably coupled to the input, the active analog filter including a first number of active devices for providing a power gain, the active analog filter being of an Nth order, wherein N exceeds the first number of active devices.

2. The loop filter according to claim 1, wherein at least one of said active devices comprises an operational amplifier.

3. The loop filter according to claim 1, wherein at least one of said active devices comprises a transconductance amplifier.

4. The loop filter according to claim 1, wherein at least one of said active device comprises a voltage to current converter.

5. The loop filter according to claim 1, wherein said active analog filter comprises a plurality of series connected cascaded analog filter elements.

6. The loop filter according to claim 5, wherein said cascaded analog filter elements comprise cascaded biquad filter elements.

7. The loop filter according to claim 6, wherein said cascaded analog filter elements comprise cascaded lattice filter elements.

8. The loop filter according to claim 6, wherein at least one biquad filter element is a Sallen-and-Key filter element.

9. The loop filter according to claim 1, wherein the active analog filter includes at least one Sallen-and-Key filter element.

10. The loop filter according to claim 1, further comprising an output terminal operably connected to provide a loop filter output signal to a quantizer which quantizes the loop filter output signal to generate said digital output signal.

11. The loop filter according to claim 10, wherein the analog active filter comprises a third order filter and the first number of active devices is two.

12. The loop filter according to claim 1, wherein said loop filter comprises at least one digital-analog-converter (DAC) operable to receive the digital output signal and generate an analog signal based thereon.

13. The loop filter according to claim 12, wherein the input signal comprises the analog signal generated by the DAC added to the analog input signal.

14. A sigma delta analog-digital-converter which converts an analog input signal to a digital output signal, comprising:
   a loop filter which comprises an active analog filter, the active analog filter that includes a first number of active devices providing a power gain, the first number of active devices lower than a filter order of said active analog filter; and
   a quantizer which quantizes a loop filter output signal of said active loop filter to generate said digital output signal.

15. The sigma delta analog-digital-converter according to claim 14, wherein said loop filter includes a first input terminal for applying said analog input signal.

16. The sigma delta analog-digital-converter according to claim 15, wherein the loop filter further comprises a second input terminal configured to receive the digital output signal of said quantizer.

17. The sigma delta analog-digital-converter according to claim 16, wherein said loop filter comprises at least one digital-analog-converter operably coupled to convert the digital output signal received at said second input terminal of said loop filter into an analog signal.

18. The sigma delta analog-digital-converter according to claim 17, wherein the analog signal generated by said digital-analog-converter is added to the analog input signal applied to said first input terminal of said loop filter.

19. The loop filter according to claim 14, wherein the active analog filter includes at least one biquad filter element.

20. The loop filter according to claim 19, wherein said at least one biquad filter element is a Sallen-and-Key filter element.

* * * * *